(12) United States Patent
Feiweier et al.

(10) Patent No.: US 8,487,617 B2
(45) Date of Patent: Jul. 16, 2013

(54) MAGNETIC RESONANCE METHOD AND APPARATUS TO REDUCE DISTORTIONS IN DIFFUSION IMAGES

(75) Inventors: Thorsten Feiweier, Poxdorf (DE); Tony Hyun Kim, Cambridge, MA (US); David Andrew Porter, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 294 days.

(21) Appl. No.: 13/076,763

(22) Filed: Mar. 31, 2011

(65) Prior Publication Data
US 2011/0241679 A1 Oct. 6, 2011

(30) Foreign Application Priority Data
Mar. 31, 2010 (DE) .......................... 10 2010 013 605

(51) Int. Cl.
*G01V 3/00* (2006.01)
(52) U.S. Cl.
USPC .......................................... 324/314; 324/322
(58) Field of Classification Search
USPC .......................... 324/300–322; 600/407–445
See application file for complete search history.

(56) References Cited

U.S. PATENT DOCUMENTS

| | | | |
|---|---|---|---|
| 2007/0223832 | A1 | 9/2007 | Matsumoto |
| 2010/0171498 | A1 | 7/2010 | Auslender et al. |
| 2011/0052031 | A1 | 3/2011 | Feiweier et al. |
| 2011/0085722 | A1 | 4/2011 | Feiweier |
| 2011/0172517 | A1* | 7/2011 | Schmidt ........................ 600/411 |
| 2011/0187367 | A1* | 8/2011 | Feiweier et al. .............. 324/309 |
| 2011/0199084 | A1* | 8/2011 | Hasan ........................... 324/309 |
| 2011/0304334 | A1* | 12/2011 | Feiweier ....................... 324/314 |
| 2012/0068702 | A1* | 3/2012 | Feiweier ....................... 324/309 |

OTHER PUBLICATIONS

"Eddy Current Correction in Diffusion-Weighted Imaging Using Pairs of Images Acquired With Opposite Diffusion Gradient Polarity," Bodammer et al, Magnetic Resonance in Medicine, vol. 51 (2004), pp. 188-193.
"Correction for Distortion of Echo-Planar Images Used to Calculate the Apparent Diffusion Coefficient," Haselgrove et al., Magnetic Resonance in Medicine, vol. 36 (1996), pp. 960-964.
"Mutual Information," Article from Scholarpedia, Latham et al. (2009), Revision #72954.
"Comprehensive Approach for Correction of Motion and Distortion in Diffusion-Weighted MRI," Rohde et al., Magnetic Resonance in Medicine, vol. 51 (2004), pp. 103-114.
"Correction of Eddy Current-Induced Artefacts in Diffusion Tensor Imaging Using Iterative Cross-Correlation," Bastin, Magnetic Resonance Imaging, vol. 17, No. 7 (1999), pp. 1011-1024.
"Correction of Eddy-Current Distortions in Diffusion Tensor Images Using the Known Directions and Strengths of Diffusion Gradients," Jiancheng et al., Journal of Magnetic Resonance Imaging, vol. 24 (2006) pp. 1188-1193.
U.S. Appl. No. 13/020,302, filed Feb. 4, 2011.

\* cited by examiner

*Primary Examiner* — Brij Shrivastav
(74) *Attorney, Agent, or Firm* — Schiff Hardin LLP

(57) ABSTRACT

In a method and apparatus to reduce distortions in diffusion imaging, at least one first measurement is implemented with a first diffusion weighting for a number of slices that are spatially separated from one another and at least one second measurement is implemented with a second diffusion weighting for the number of slices that are spatially separated from one another. A deskewing function is determined as are correction parameters to deskew diffusion-weighted magnetic resonance images on the basis of the measurements, so that image information and/or correction parameters of different slices are linked with one another. The diffusion-weighted magnetic resonance images are distortion-corrected on the basis of the deskewing function and the correction parameters.

14 Claims, 5 Drawing Sheets

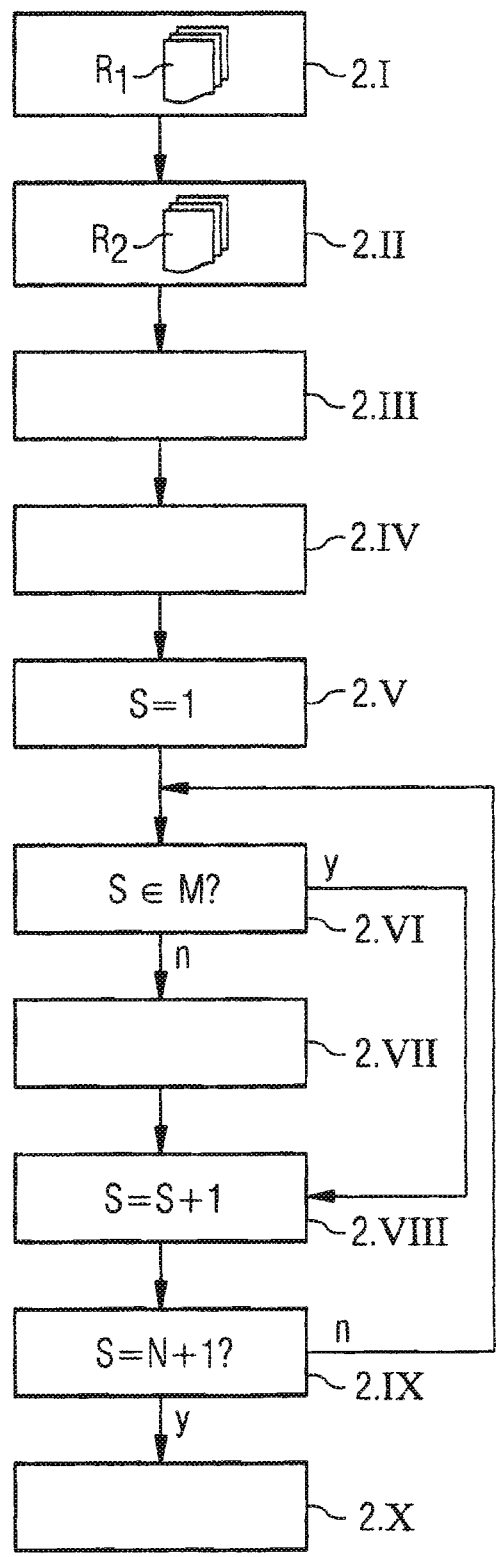

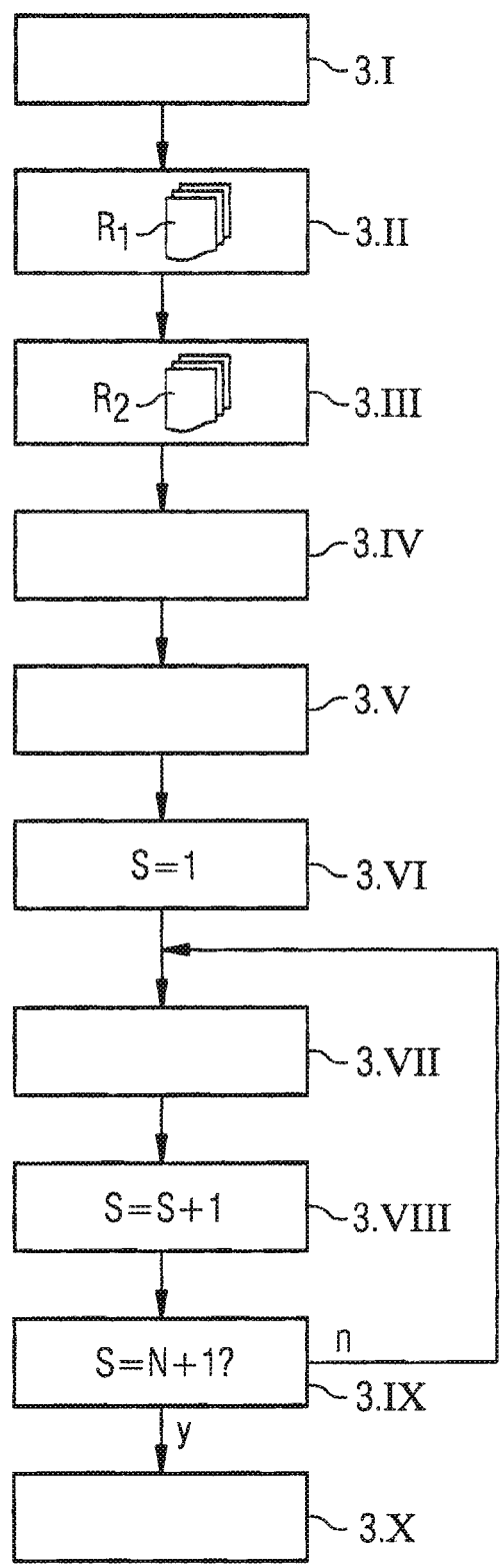

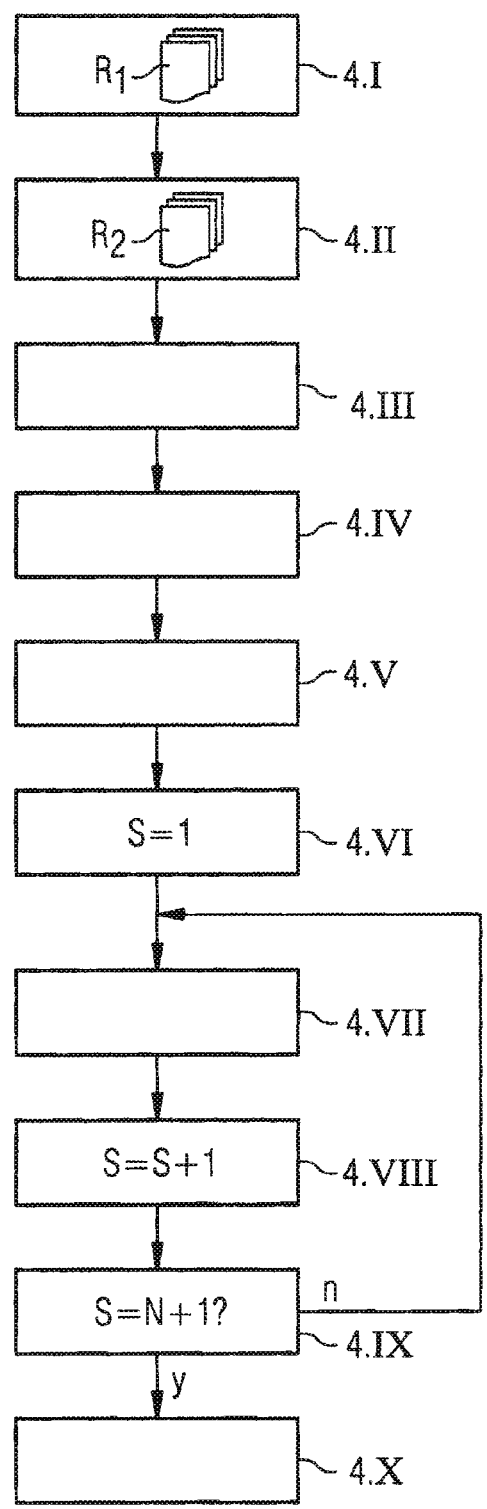

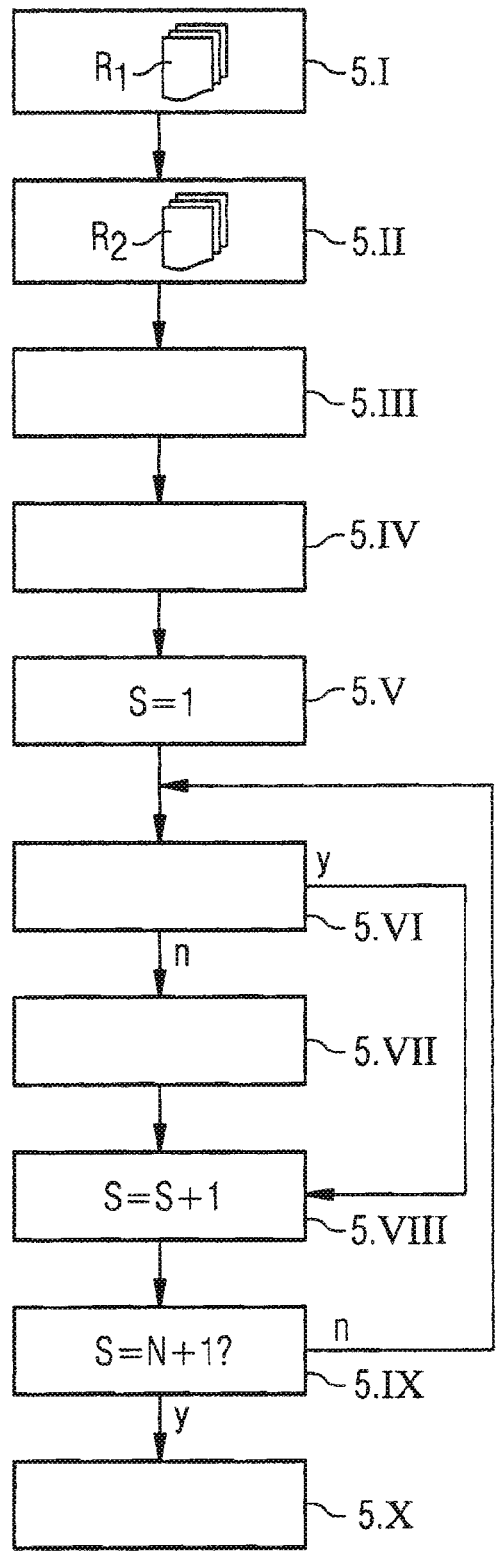

MAGNETIC RESONANCE METHOD AND APPARATUS TO REDUCE DISTORTIONS IN DIFFUSION IMAGES

BACKGROUND OF THE INVENTION

1. Field of the Invention

The present invention concerns a method to correct image distortions that can occur in the acquisition of diffusion-weighted magnetic resonance images (also called "MR images" in the following) of an examination subject, as well as a magnetic resonance system (also called an "MR system" in the following) with which such a method can be implemented.

2. Description of the Prior Art

In diffusion imaging, multiple images are normally acquired with different diffusion directions and diffusion weightings and combined with one another. The strength of the diffusion weighting is primarily defined by a factor known as the "b-value". The diffusion images with different diffusion directions and diffusion weightings, or images combined from such images can then be used for diagnostic purposes. Parameter maps with particular diagnostic significance thus can be generated by suitable combinations of the acquired diffusion-weighted images, for example maps that reflect the "Apparent Diffusion Coefficient (ADC)" or the "Fractional Anisotropy (FA)".

Eddy current fields can be caused by the diffusion gradients, and such eddy current fields in turn lead to image distortions whose appearance depends both on the amplitude of the gradients—i.e. the diffusion weighting—and on their direction. If the acquired individual images are then combined with one another without correction, for example in order to generate the cited parameter maps, the different distortions for each image lead to incorrect associations of pixel information, and therefore to errors or at least to a reduced precision of the calculated parameters. Particularly, in diffusion-weighted images that were acquired with the use of the echoplanar technique (EPI), eddy current-dependent distortions represent a particularly significant challenge since there is typically a particularly high sensitivity (approximately 10 Hz per pixel in the phase coding direction) to static and dynamic field disruptions in EPI imaging, and is precisely in that context that high gradient amplitudes are used to adjust the diffusion gradients.

The complex spatial geometry of the original dynamic interference fields leads to the situation that, in multislice exposures, the distortions depend on the position and orientation of every individual slice.

Multiple image-based methods are known for the correction of eddy current-dependent distortions in diffusion imaging. For example, in a publication by Haselgrove et al. (in MRM 36: 960-964, 1996) a method is described in which initially an undistorted MR reference image is acquired with a diffusion weighting b=0, i.e. without application of a diffusion gradient. Furthermore, a second adjustment measurement with low diffusion weighting for the direction to be corrected is acquired. A low diffusion weighting thereby means a b-value of 150 s/m², for example. It is then assumed that the distortions in the images can be described in good approximation as simple affine transformations with a scaling N, a shear S and a shift or a translation T. Therefore distortion parameters for M, S and T are determined with the use of the two adjustment measurements, i.e. the measurement of the reference image and the image with low diffusion weighting. The distortion parameters M, S and T that are thus determined are then used (using an extrapolation relationship) for the correction of the actual diffusion-weighted usable MR images, in which the b-value amounts to 1000 s/m², for example. This method requires at least one adjustment measurement for each diffusion direction.

Furthermore, in a publication by Bodammer et al. (in MRM 51: 188-193, 2004) a method is described in which two images with identical diffusion direction and diffusion weighting but inverted polarity are acquired within the scope of adjustment measurements. While the diffusion contrast remains unchanged given an inverted polarity, the inversion affects the distortion as an inversion. This means that an elongation becomes a compression, a positive shear becomes a negative shear and a positive translation becomes a negative translation. In this method two images must respectively be acquired for each diffusion direction and for each diffusion weighting.

It is common to the methods that they each operate at individual slices, meaning that a registration of the distorted image with a reference image is conducted individually for each slice. Two classes of methods can thereby be differentiated:

A) The direct registration of the measurement data:

A reference image is hereby acquired for each slice during the measurement, normally at the beginning of the measurement. All distorted images acquired during the measurement are then immediately deskewed via a registration to the corresponding reference image. This procedure has the advantage that the correction is independent of model assumptions. However, the process time—i.e. the calculation time for deskewing—is relatively long.

B) Use of an adjustment measurement:

Targeted reference images and defined distorted images are hereby acquired before the actual measurement—for example via application of only one x-, y- or z-diffusion gradient with a specific amplitude—and the deskewing parameters are calculated for the defined distorted images. From these values, suitable correction parameters for the images of the usable measurements are calculated on the basis of physical model assumptions. In general it is assumed that the distortions of the three gradient axes overlap in an undistorted manner, and that the distortions scale linearly with the gradient amplitude. This method has the advantage that it also functions for measurement data with a very low SNR (signal-to-noise ratio), for example given very high b-values during the actual usable measurement, since the adjustment measurement can be implemented with smaller b-values. Given a suitable embodiment of the method, this is robust against movement influences. Such a method is described in DE 10 2009 003 883 B3, for example. However, in this method the measurement time is relatively long due to the additional adjustment measurements.

SUMMARY OF THE INVENTION

An object of the present invention is to provide an improved method to reduce distortions in diffusion imaging, with which the process time to correct the measurement data and/or the measurement time can be reduced, and/or the precision or robustness of the corrections can be improved.

In the method according to the invention, at least one first measurement with a first diffusion weighting is initially implemented for a number of slices that are spatially spaced apart from one another. These can be slices positioned in parallel in a coordinate system, advantageously in a logical image coordinate system. The logical "imaging coordinate system" is a coordinate system with a first coordinate axis in a readout direction (this coordinate is designated as an r-coordinate in the following) and a second coordinate axis in a phase coding direction (this coordinate is designated as a p-coordinate in the following). Normally all magnetic resonance images are acquired in this imaging coordinate system.

At least one second measurement with a second diffusion weighting is then implemented for the same slices.

Depending on how the concrete further use of the measurement appears, the first and second measurement can be measurements of different design. It is normally the case that undistorted reference images are acquired in one of the measurements (as a reference measurement), i.e. with a diffusion weighting of b=0, as this is the case in the method from Haselgrove et al., for example. It is likewise possible that the images are also distorted in the reference measurement (i.e. in both measurements), as this is the case in the method from Bodammer et al., for example.

In principle, both the first measurement and the second measurement can serve purely as adjustment or reference measurements in order to determine a deskewing function and the correction parameters from these. In some variants of the invention, however, at least one measurement (possibly also both measurements, i.e. both the first and the second measurement) serve simultaneously as usable measurements, and the images that are thereby generated are directly used for a diagnosis after the correction. For example, this is the case if a direct registration of the diffusion-weighted diagnostic images with reference images occurs using the described method (measurements of the aforementioned category A). Additional usable measurements are then no longer absolutely necessary. However, since the first and second measurements in the method according to the invention are always used as an adjustment measurement to determine the deskewing functions, they are designated as adjustment measurements in the following without limitation of the generality.

The determination of a deskewing function and of correction parameters to deskew the diffusion-weighted magnetic resonance images then takes place on the basis of these adjustment measurements. According to the invention, image information and/or correction parameters of different slices are thereby linked with one another, in particular to determine correction parameters.

At least a portion of the correction parameters can thereby be determined by means of simplex maximization of a similarity function, for example with an iterative optimization method. The similarity of an adjustment image from the one adjustment measurement with a corresponding image from the second adjustment measurement is assessed on the basis of a measure of similarity, for example, preferably on the basis of the "Normalized Mutual Information" (NMI). An explanation of "Normalized Mutual Information" (NMI) is found in an article by Peter E. Latham and Yasser Roudi (2009), Scholarpedia, 4(1):1658. In the iterative method the optimal correction parameters are then determined as variables—in particular coefficients—of the deskewing function.

In the sense of the invention, the term "correction parameters" for an image encompasses all parameters that can be used in order to deskew the appertaining image based on them. This includes the coefficients of an analytically described deskewing function (for example a polynomial) that have already been mentioned above, which are also designated as "transformation coefficients" in the following. If these coefficients are known, the deskewing function is also completely known and can therefore be used for deskewing. However, the values of a complete "deskewing map" or of a "deskewing field" can likewise also be used as correction parameters. A deskewing map or a deskewing field means the shift determined for each pixel in the deskewing. It is also not necessary for the same type of correction parameters are used for all slices. For example, for some slices correction parameters can be determined as transformation coefficients of an analytically described deskewing function, and a deskewing field can respectively be calculated as a "derived" correction parameter based on this for the appertaining slices. Through the linking of the correction parameters of different slices according to the invention, correction parameters in the form of deskewing fields can then be determined again from this for additional slices, which correction parameters are ultimately used for the deskewing of these additional slices.

Various possibilities of linking of image information and/or correction parameters of different slices to determine correction parameters are explained in detail below.

Finally, a deskewing of the diffusion-weighted magnetic resonance images takes place on the basis of the correction parameters and the deskewing function. It should be noted that a deskewing can also be based on derived correction parameters, i.e. on the basis of deskewing maps (ultimately based on the underlying deskewing functions). In the event that (as mentioned above) the diffusion-weighted images acquired in the second adjustment measurement are used not only for the determination of the correction parameters but also as "usable images", in this step the images from the second measurement are deskewed on the basis of the correction parameters and with application of the deskewing function. Depending on the concrete application case, this step can also already take place as a last adaptation step within the framework of the optimization method to determine the optimal correction parameters.

A magnetic resonance system according to the invention requires an image acquisition unit to acquire diffusion-weighted magnetic resonance images of an examination subject and to implement each of at least one first measurement with a first diffusion weighting for a number of slices that are spatially separated from one another, and at least one second measurement with a second diffusion weighting for the number of slices spatially separated from one another. Moreover, the magnetic resonance system requires a computerized correction parameter determination unit. This correction parameter determination unit is fashioned so that, in operation, it determines a deskewing function and correction parameters to deskew diffusion-weighted magnetic resonance images on the basis of the measurements, wherein image information and/or correction parameters of different slices are linked with one another. Moreover, the magnetic resonance system according to the invention possesses an image correction unit to deskew the diffusion-weighted magnetic resonance images on the basis of the correction parameters. The correction parameter determination unit can also be integrated into the image correction unit or vice versa. Both units can be embodied in a central controller of the magnetic resonance system or in a downstream, separate image processing unit (for example a workstation serving as an image viewing and processing unit) to which the data from the adjustment measurement and the diffusion-weighted images are transmitted after the reconstruction.

The method according to the invention and the magnetic resonance system according to the invention have the advantage that the individual slices are no longer considered in isolation, as in the previous method. The realization that the spatial geometry of the image distortions between adjacent slices normally does not change suddenly but rather changes continuously. For example, a review of the structure of the dynamic interference fields that lead to the distortions has shown that these interference fields can be represented by an expansion according to spherical surface functions or, respectively, polynomials. Therefore, via the combination of image information and/or correction parameters from different slices, different advantages can be achieved depending on the precise embodiment of the method.

For example, given a deskewing with a method that counts among the Class A described above—i.e. given a direct registration of the measurement—the correction parameters for some of the slices can be determined significantly more quickly via suitable interpolation methods. Processing time in the image correction can consequently be saved. Given methods according to the Class B described above, for example, it is possible to reduce the measurement time via interpolation methods. However, it is likewise also possible to combine the information from adjacent images (for example via averaging methods) so that overall a more robust and precise correction is achieved.

As indicated above, there are various possibilities for the linking of the image information and/or correction parameters of different slices.

In a first preferred embodiment of the invention, start values to determine second correction parameters for second slices are determined based on first correction parameters determined for first slices, for example in an iterative optimization method. In particular the first correction parameters themselves can thereby also form the start values. For example, in this method variant it is possible to selectively determine the correction parameters for individual slices of a complete slice stack in the form of transformation coefficients with a conventional method on the basis of first and second adjustment measurement, wherein the start values for the optimization method are also selected with a conventional method. For example, the "simplex maximization" method described above lends itself to this. If the correction parameters are then determined for these slices, they can be used as start values in the similar optimization methods for the other (adjacent or, respectively, interposed) slices. It is assumed that these start values can already be relatively close to the optimal correction parameters for these slices. The optimization method for these slices can consequently very quickly arrive at optimal results with high probability via the specification of the start values. The entire method is thereby significantly accelerated.

In a further variant, first correction parameters for first slices are respectively determined on the basis of first and second measurements, at which first slices the appertaining first and second measurements have been conducted. For second slices situated between the first slices, interpolated correction parameters are then determined with the aid of first correction parameters. An optimization method for the interposed second slices is thus not necessary with this method variant, and instead an interpolation function across the correction parameters determined for the first slices is used.

Particularly, in this variant it is useful to initially determine correction parameters for the first slices in the form of transformation coefficients of an analytically described deskewing function and to calculate respectively derived correction parameters in the form of a deskewing field from the determined correction parameters. For the second slices, interpolated deskewing fields are determined from these as correction parameters, and the deskewing of the first and second slices is conducted on the basis of the calculated or interpolated deskewing fields. One advantage of this implementation is that the actual image correction unit does not need to have knowledge of the analytical description of the deskewing function. The image correction unit merely requires the calculated deskewing fields and can interpolate additional deskewing fields from these fields.

In a preferred variant the first and second adjustment measurements are implemented only at the slices for which the correction parameters are also determined on the basis of the associated adjustment measurements. This has the advantage that overall fewer measurements are required since an adjustment measurement does not need to be conducted for each of the slices. This method is particularly suitable when a method according to Class B (described above) is implemented.

If the correction parameters in the form of transformation coefficients—be they as start values or as interpolated, finished correction parameters—are obtained from adjacent slices, the deskewing function for the second slices naturally has a form identical to that for the first slices. Only the correction parameters used therein (i.e. the variable parameters of the deskewing function that are to be optimized) are determined as described using the correction parameters of the first slices.

In the latter method, in which interpolated correction parameters are determined from the correction parameters of individual slices for the interposed second slices, these interpolated correction parameters can in principle also be used as start values to obtain transformation coefficients in an optimization method for the second slices.

In an additional variant, the items of image information or the correction parameters of different slices are linked with one another via averaging. For example, in a preferred variant image data obtained in adjacent slices in the first and second measurements are averaged and a deskewing function and/or correction parameters to deskew diffusion-weighted magnetic resonance images are determined based on the averaged image data.

From the correction parameters determined on the basis of the averaged image data, by means of a spatial conversion function the correction parameters for various slices can then advantageously be determined depending on a slice position. For example, his spatial conversion function can comprise a polynomial function or a spline function.

A simple example of this is the use of a linear function. For example, if an averaging of the slice pairs $z_0$ and $z_1$, and $z_2$ and $z_3$, takes place (the index designating the spatial order of the slices equidistant in the simplest case), an effective deskewing field $V(x,y,z_{\mathit{eff1}})$ results at the position $z_{\mathit{eff1}}=(z_0+z_1)/2$ from the correction of the first slice pair and $V(x,y,z_{\mathit{eff2}})$ at the position $z_{\mathit{eff2}}=(z_2+z_3)/2$ from the correction of the second slice pair. The deskewing fields for the two slices $z_1$ and $z_2$ situated between these effective positions $z_{\mathit{eff1}}$ and $z_{\mathit{eff2}}$ can then be determined with a linear conversion function, for example.

$$v(x, y, z_i) = \frac{(z_i - z_{\mathit{eff1}}) \cdot v(x, y, z_{\mathit{eff2}}) - (z_i - z_{\mathit{eff2}}) \cdot v(x, y, z_{\mathit{eff1}})}{(z_{\mathit{eff2}} - z_{\mathit{eff1}})}$$

with i=1, 2.

In this way an optimal deskewing for each slice can thus be calculated quickly.

A combination of the previously described methods is also possible. For example, for some slices the correction parameters and the deskewing function are determined via averaging of adjacent slices in order to in turn determine matching correction parameters for other slices from these correction parameters via interpolation, which matching correction parameters are possibly also used again only as start values in an optimization method for the appertaining slices. The precise selection of the method thereby depends on—among other things—the specific, required precision for the respective measurements, the interferences that are to be expected, but also on the available measurement and/or processing time.

In an additional variant of the method, a deskewing function and correction parameters are initially determined for a slice only on the basis of the measurements implemented for this slice. A deskewing result determined with this deskewing function or, respectively, these correction parameters is then subject to a quality check. If it arises in this quality check that a predetermined quality criterion is not satisfied, a new, improved deskewing function and/or new correction parameters are determined under consideration of image information and/or correction parameters of adjacent slices. For example, the quality criterion can be a limit value for the maximum displacement of a pixel in an image. If the correction determines a larger shift for any pixel in the image, the result is classified as unreliable and the quality criterion is thus not satisfied. For example, a too-large deskewing can occur due to a movement of the patient in the acquisition and/or too low an SNR. This variant can in principle be implemented for all slices, i.e. in such a method a conventional deskewing is always implemented first and the linking of the image information and/or correction parameters in the manner according to the invention is only utilized when a presumably unreliable result has been achieved with the conventional deskewing. In this variant no time savings is thus achieved relative to the invention method; however, the quality of the deskewing can be significantly improved.

In a further variant, a filter function is initially applied to correction parameters of different slices before the correction parameters or, respectively, deskewing maps are used for a deskewing. A smoothing of the corresponding values across adjacent slices can take place via such a filtering of the correction parameters. This is suitable for all forms of correction parameters, i.e. both to transformation coefficients and to values of distortion maps. For example, a Gaussian filter can be used as a filter function. Since it is to be assumed from this that the distortions change only slowly across the slices, via such a filtering it can be achieved that systematic and/or static fluctuations or, respectively, even real outliers can be compensated in the correction of individual slices. This filtering of the correction parameters can also be used independent of whether a linking of image information and/or correction parameters of different slices has already taken place in the determination of the correction parameters, or whether all correction parameters for the individual slices are respectively determined via separate optimization methods from the adjustment measurements implemented for these slices. Such a filter function is ultimately a linking of image information or correction parameters of different slices.

In principle the deskewing functions can be constructed arbitrarily; for example, these can hereby be deskewing functions that, in a conventional manner, only take into account the affine transformations (translation, scaling, shear), i.e. image distortions of zeroth and first order. Such simple deskewing functions are used under the assumption that the dominant residual dynamic interference fields exhibit the same geometric in their spatial distribution as the causes of the interference (i.e. the diffusion gradients). However, this assumption is not always correct in modern MR systems. For example, there the homologous interference fields can be compensated via a pre-distortion of the gradient pulse shape insofar as that the residual interference fields have more complex spatial geometry. Therefore, in a particularly preferred variant the deskewing function is a non-linear, system-specific deskewing function that is determined on the basis of system-specific information. With such a system-specific deskewing function it is possible to correct image distortions beyond affine transformations, wherein the deskewing function is not, however, overly complex, such that the correction computation cost is not too high.

In addition to this, such a deskewing function is better adapted to the actual existing interference conditions than given previous methods and therefore can lead to more precise corrections. Within the scope of the invention, the term "system-specific" encompasses the term "system type-specific", meaning that information about the gradient coil design used in the system type (for example) or other structural information is used.

The determination of the system-specific deskewing function can thereby also be based on heuristic information; for example, it can turn out for a specific system type that essentially interference fields of a first order and of a specific additional term of a higher order occur upon switching a diffusion gradient in an x-direction (the Cartesian coordinate system of the system or, respectively, of the gradient coils). This knowledge can then serve directly to establish a system-specific deskewing function. Other system-specific information or methods to establish the system-specific deskewing function can likewise supplemented with such heuristic information.

However, the system-specific information preferably includes direct parameters of a field geometry occurring upon application of a gradient field in the appertaining magnetic resonance system. For example, the system-specific information can comprise (insofar as it is possible) the complete mathematical description of this field geometry depending on the respective applied gradient field.

In a preferred exemplary embodiment of the invention, a system-specific geometry of field distortions is respectively defined to determine the system-specific deskewing function for different gradient axes of the magnetic resonance system. For example, the dynamic field disruptions can hereby be dimensioned. It is sufficient to conduct this once in an installation of the system—normally for each individual system in a set-up step (also called a "tune-up" step in the following)—or to only conduct these measurements again when structural modifications have been made to the magnetic resonance system that could possibly affect the field geometry.

Such measurements can likewise be conducted within the scope of the regular maintenance.

In a preferred exemplary embodiment, to determine a non-linear, system-specific deskewing function, those polynomial elements of a non-linear polynomial transformation function are determined that—according to a predetermined relevance criterion—would lead to relevant image transformations under consideration of system-specific information upon application of a diffusion gradient. In this variant it is thus assumed that a deskewing function can be established from a polynomial transformation function of higher order (>1), wherein normally only a few polynomial elements actually lead to relevant transformations in the image (i.e. to distortions) upon application of diffusion gradients. Only these "relevant" polynomial elements are then used in the deskewing function. The correction parameter determination unit of the MR system is accordingly preferably fashioned so that it is in the position to determine the relevant polynomial elements, advantageously wholly automatically but possibly also by querying operator inputs, and to form a corresponding deskewing function.

Which polynomial elements are to be classified as "relevant" in this sense depends on the individual geometry of the interference fields. The examination of the polynomial elements with regard to their relevancy accordingly takes place under consideration of the system-specific information, i.e. for example on the basis of the data about the field geometry of the gradient coils, the materials of the patient tunnel that are used and additional components that could possibly lead to interference fields in the application of gradient fields, or on the basis of similar data. In this method heuristic information can also be used exclusively or partially as system-specific information, meaning that a selection of the relevant system-specific polynomial elements can also take place purely on a heuristic basis.

The relevancy criterion or, respectively, the relevancy criteria to establish whether an image transformation is "relevant" can be established in different ways. A determination of the relevancy of an image transformation of a polynomial element can advantageously take place on the basis of a shift of test image pixels between two magnetic resonance images generated in the adjustment measurements, which shift is to be associated with the polynomial element. This means that a specific test pixel in a magnetic resonance image of a first adjustment measurement and the shift of this test image pixel in a corresponding magnetic resonance image from the second adjustment measurement are considered. The test image pixels can be specific selected pixels or even all pixels of the image. Likewise, a weighted evaluation of the shift can also take place, for example a weighting by means of the image intensity of the individual pixels.

The complete specification of the system-specific geometry of the dynamic field disruptions thereby advantageously takes place in a physical coordinate system of the magnetic resonance system (i.e. of the gradient coil system) or, respectively, in typical Cartesian coordinates or spherical coordinates. The geometry of the interference fields of each gradient axis is thus measured and stored, for example in x-, y-, z-coordinates, i.e. along the gradient axes of the system. Corresponding measurement methods that are generally conducted on phantoms are known to the man skilled in the art and therefore do not need to be explained in detail here. The magnetic resonance system according to the invention particularly preferably has a suitable memory in which data about a system-specific geometry of field distortions are respectively stored for various gradient axes of the magnetic resonance system. However, a deskewing of the magnetic resonance images reasonably most often takes place in the aforementioned logical "imaging coordinate system". A transformation of the field disruption geometry from the selected physical coordinate system (for example the x-, y-, z-coordinate system or a spherical coordinate system of the magnetic resonance system) into the logical imaging coordinate system can then take place depending on the slice position, i.e. depending on the location and the orientation of the respective magnetic resonance image.

Since the bandwidth is typically greater by a factor of 100 in the readout direction r than in the phase coding direction p, normally no relevant distortion occurs in the readout direction r relative to the phase coding direction p. Therefore a deskewing of the magnetic resonance images also preferably takes place only in a phase coding direction. This has the advantage that only this direction must be taken into account in the determination of the correction parameters, and thus the number of correction parameters to be determined is lower, whereby significant computing effort can be saved given the later correction with application of the correction parameters.

A more elaborate description of the use of system-specific deskewing functions is provided in DE 10 2010 001577, the content of which is incorporated herein by reference.

Independent of the type of correction, a problem exists in that effects with temporal history are not taken into account in multislice measurements. Namely, in multislice exposures it has turned out that the distortions frequently have a dependency on the acquisition order of the images, which is due to the continuous development of a steady state of the interference fields. Such infeed phenomena can in fact be reduced in that different diffusion weightings or diffusion directions are worked with in the successive slice acquisition. For example, inverted diffusion directions can be used in successive slices, with the diffusion contrast of each slice being identical. The slices can in fact then have reduced distortions overall, but the development and geometry of the distortions can change from slice to slice in a manner that is difficult to predict, which makes the corrections markedly more difficult. In a preferred variant, a number of preparation gradient pulses corresponding to the diffusion weighting of the following adjustment measurement and/or usable measurement is therefore applied before an implementation of said adjustment measurement and/or usable measurement. No data are acquired in these preparation pulses and no spins are excited, meaning that no RF pulses are applied; the gradients are merely switched corresponding to the following measurement. In this way the first slice of the actual measurement can already be acquired nearly at a steady state. Since the typical time constants are in the range of a few 100 ms and the typical slice acquisition duration is in the range of 100 ms, for example, 3 to 5 additional preparation pulses is generally sufficient.

Additionally or alternatively, the unwanted infeed phenomena can also be reduced in that the diffusion direction and/or diffusion weighting can be changed only slowly in successive measurements. For example, this can be achieved by using monotonically increasing b-values and by using the spatially nearest neighbor diffusion direction.

BRIEF DESCRIPTION OF THE DRAWINGS

FIG. 2 is a flowchart of the basic steps to correct distortions according to a first exemplary embodiment of the invention.

FIG. 3 is a flowchart of the basic steps to correct distortions according to a second exemplary embodiment of the invention.

FIG. 4 is a flowchart of the basic steps to correct distortions according to a third exemplary embodiment of the invention.

FIG. 5 is a flowchart of the basic steps to correct distortions according to a fourth exemplary embodiment of the invention.

DESCRIPTION OF THE PREFERRED EMBODIMENTS

Figure 1:
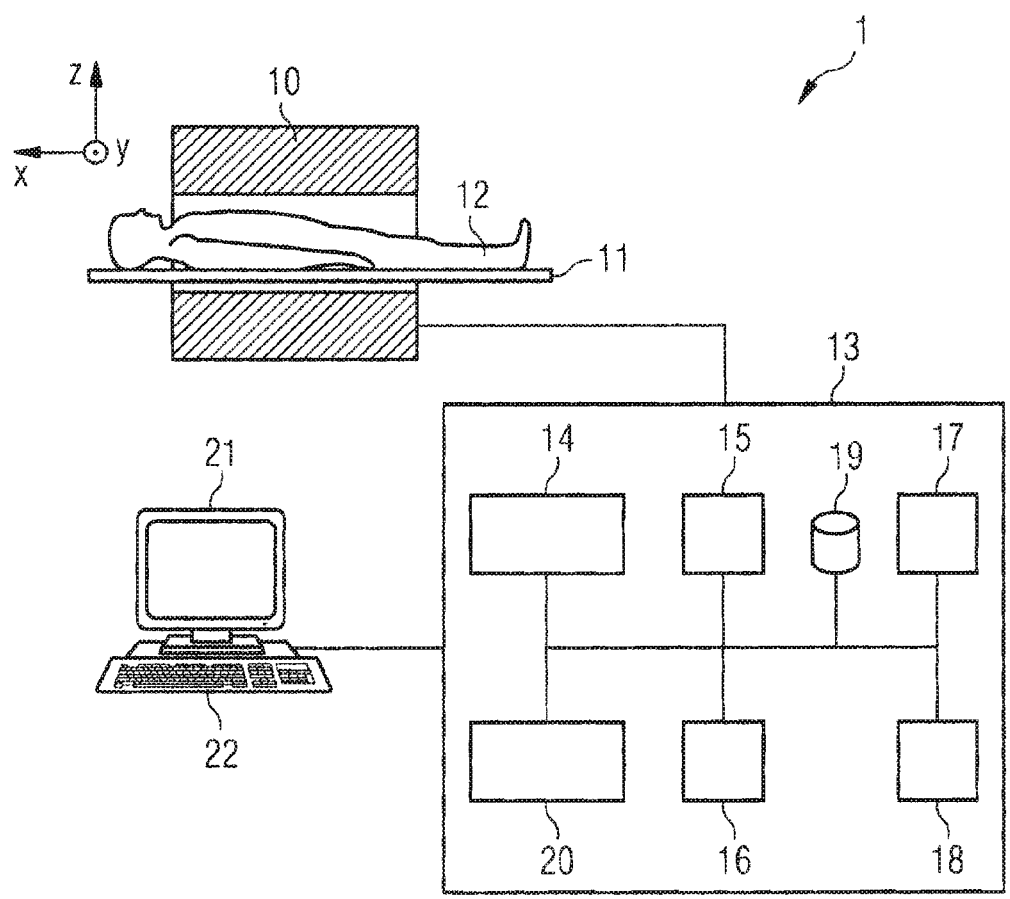
FIG. 1 schematically illustrates an MR system according to an exemplary embodiment of the invention.

A magnetic resonance system 1 according to the invention is shown schematically in FIG. 1. The system includes the actual magnetic resonance scanner 10 with an examination space or patient tunnel into which an examination subject 12 (here a patient or test subject) can be moved on a bed 11. The magnetic resonance scanner 10 is equipped in a typical manner with a basic field magnet system, a gradient coil system and a transmission and reception antenna system which, for example, includes a whole-body coil permanently installed in the magnetic resonance scanner 10 and possibly additional local coils that are to be arranged selectively on the examination subject 12.

The MR system 1 furthermore has a computerized central control unit 13 that is used to control the entire MR system 1.

The central control unit 13 includes an image acquisition unit 14 for pulse sequence control. In this the sequence of RF pulses and gradient pulses is controlled depending on a selected imaging sequence. The central control unit 13 has an RF unit 15 to output the individual RF pulses and a gradient unit 16 to control the gradient pulses, which RF unit 15 and gradient unit 16 communicate correspondingly with the image acquisition unit 14 to emit the pulse sequences. The RF unit 15 includes not only a transmission part in order to emit the RF pulse sequences but also a reception part in order to acquire coordinated raw magnetic resonance data. A reconstruction unit 20 accepts the acquired raw data and reconstructs the MR images from these.

How suitable raw data can be acquired via a radiation of RF pulses and the generation of gradient fields and MR images can be reconstructed from these raw data is fundamentally known to those skilled in the art and need not be explained in detail herein.

Operation of the central control unit 13 can take place with an input unit 22 and a display unit 21 via which the entire MR system 1 can thus also be operated by one operator. MR images can also be displayed on the display unit 21, and measurements can be planned and started as necessary with the display unit 21 by means of the input unit 22.

In addition to the gradients for the spatial coding during a measurement, diffusion gradients of different strength are switched to create diffusion-weighted images. The principle of the acquisition of diffusion-weighted magnetic resonance images is also known to those skilled in the art and therefore need not be explained in detail herein.

As explained above, the additional diffusion gradients switched to create diffusion-weighted images cause a distortion in the acquired magnetic resonance images. In particular in echoplanar imaging, a shift $V(r,p)$ of the image information within the image plane occurs dominantly along the phase coding direction p, an in fact proportionally to the amplitudes of the local interference field $B(r,p)$ and inversely proportionally to the pixel bandwidth BW along this direction, meaning that $$V(r, p) = \frac{B(r, p)}{BW} \quad (1)$$

applies. Since the bandwidth BW is typically greater by a factor of 100 in the readout direction than in the phase coding direction, no relevant distortion occurs in the readout direction r. In the logical imaging coordinate system, r,p therefore generally represents the transformation or, respectively, distortion due to the interference fields as follows:

$$r'=r \quad (2a)$$

$$p'=p+V(r,p) \quad (2b)$$

The shift or distortion V can also generally be written as a polynomial distortion function as follows:

$$V = \sum_{ij} a_{ij} r'^i p^j = \sum_{ij} V_{ij}(r, p) \quad (3)$$

Arbitrary distortion geometries along the phase coding direction p can be described with such a distortion function V. If the coefficients $a_{ij}$ of the function V are known, a distorted image can be back-calculated into an undistorted, corrected image with the function V. The coefficients $a_{ij}$ (i.e. the transformation coefficients) are thus the sought correction parameters.

However, within the scope of the invention an arbitrarily different deskewing function, in particular a different linear combination of orthogonal functions, can also be used (except for the deskewing function given in Equation (3)). This equation represents only the simplest (and therefore preferred) exemplary embodiment of a general polynomial transformation function in imaging coordinates. If—as has previously normally been the case—only a translation T, a scaling M and a shear S are taken into account in the deskewing, this function V reduces to $$V(r,p)=a_{00}+a_{10}r+a_{01}p=T+M\cdot p+S\cdot r \quad (3a)$$

FIG. 2 schematically shows a possible method workflow to measure and correct diffusion images. In the following it is assumed that a slice stack with N slices in total should be acquired.

In a first method step 2.I, a first adjustment measurement $R_1$ is initially implemented for each of the N slices, meaning that at least one reference image is acquired, for example an undistorted reference image with a diffusion weighting b=0. This first exposure can also already be used as a diagnostic exposure. In a second method step 2.II an additional adjustment measurement $R_2$ is subsequently implemented for each of the N slices and at least one respective additional image is acquired, wherein here however a different diffusion gradient is switched and thus the image is distorted correspondingly by the interference field of the diffusion gradient. This second measurement is simultaneously also the usable measurement, i.e. the images acquired here are later deskewed and used for diagnostic purposes, for example. Moreover, in the first adjustment measurement $R_1$ distorted images can also be acquired, for example with the same diffusion weighting but opposite diffusion direction than in the second measurement $R_2$.

A suitable polynomial distortion function is then initially selected in a specific manner according to Equation (3) in Step 2.III. However, in the optimization method typically used to determine the coefficients $a_{ij}$ of the function V it applies that—as in any optimization method—the robustness of the method decreases (because the "similarity area" has an increasing number of local maxima) and the computing effort increases with an increasing number of parameters to be determined. For this reason a limitation of the correction parameters to be calculated is reasonable. A simple possibility would be a limitation to polynomial elements of the second order:

$$V(r,p)=a_{00}+a_{10}r+a_{01}p+a_{11}rp+a_{20}r^2+a_{02}p^2 \quad (4a)$$

or third order:

$$V(r,p)=a_{00}+a_{10}r+a_{01}p+a_{11}rp+a_{20}r^2+a_{02}p^2+a_{21}rp^2+a_{12}r^2p+a_{30}r^3+a_{03}p^3 \quad (4b)$$

However, it can be shown experimentally that a polynomial of second order still does not describe the occurring distortions with sufficient precision. However, if the polynomial distortion function of third order according to Equation (4b) is simply used as a distortion function, in total ten coefficients $a_{ij}$ must be determined as correction parameters, such that the desired robust and fast adaptation of the measurement data is often not possible. Therefore, in Step 2.III system-specific information is used in order to identify in the non-linear polynomial transformation function according to Equation (4b) the polynomial elements that lead to relevant image transformations under consideration of this system-specific information upon application of a diffusion gradient during the measurement, wherein the relevance of the image transformations is assessed with a predetermined relevancy criterion. It is noted that in the following the formulations "relevant transformations" or "relevant polynomial elements" that are selected are also used synonymously, even though (naturally) it is checked which polynomial elements lead to relevant transformations and then these polynomial elements are selected for the deskewing function.

In a simplified variant the selection of the relevant transformations or, respectively, polynomial elements can take place completely or additionally on the basis of heuristic information, For example, in measurements of longer duration with high gradient load it is found that thermal effects can lead to a distortion of the basic field. In echoplanar imaging this is represented as an image shift along the phase coding direction. If the reference image was now acquired at a first amplitude and the corrected image was acquired at a second amplitude of the basic field, a transformation term $a_{00}$ is to be taken into account in the distortion correction in any case. Depending on the system type, thermal effects of a higher order (for example a first or second order) can also occur that can be accounted for in the same manner.

Alternatively, the geometry of the interference fields of each gradient axis can also be measured and stored for every individual system in a tune-up step, for example in the installation of the system and/or within the scope of the regular maintenance. Appropriate measurement methods that are generally conducted on phantoms are known to the man skilled in the art and therefore need not be explained in detail herein. The measured geometric information can be stored in a memory 19 of the system 1, for example (see FIG. 1). A more detailed representation of a mathematically more precise method for the selection of the relevant polynomial elements of a nonlinear polynomial transformation function— for example according to Equation (4b)—on the basis of the measured geometry of the interference fields is shown in DE 10 2010 001577 (cited above), the content of which is incorporated herein by reference. The deskewing function that is obtained in this manner is non-linear on the one hand, meaning that it has an order >1 and not only affine transformations. Moreover, the deskewing function has only a limited number of correction parameters to be determined since it is based on system-specific information.

Although Step 2.III is preferred within the scope of the present invention it is nevertheless optional. For example, the invention can also be used even if a simpler deskewing function (in particular a conventional affine deskewing function) is used that can in principle be pre-established for the method. In this case the deskewing function itself no longer needs to be determined, but rather only the correction parameters T ($=a_{00}$) for the translation, M ($=a_{10}$) for the scaling and S ($=a_{01}$) for the shear. However, in the following it is assumed without limitation of the generality that the optional step 2.III is implemented and a deskewing function is determined via determination of the relevant transformations.

For example, in Step 2.IV the parameters $a_{ij}$ can then be determined in an optimization method on the basis of the reference images generated in the adjustment measurements. It is thereby iteratively sought to make the distorted image of the second measurement $R_2$ as similar as possible to the corresponding undistorted image of the first measurement $R_1$ via application of the transformation according to Equation (2b). This method naturally also functions if both reference images have been distorted differently by defined diffusion gradients, for example as in the method according to Bodammer et al. that is cited above. A measure of similarity (also called a cost function) is thereby used to assess the similarity. This means that the transformation is iteratively applied to the distorted image and it is thereby sought to minimize the cost function or, respectively, to maximize the measure of similarity. A specific manner of implementation is known as "simplex optimization" (also called "Nelder-Mead downhill simplex optimization"). Alternatively, other methods to determine the coefficients $a_{ij}$ are also possible, wherein the preferred "simplex optimization" has the advantage that no derivations of the function V are required for this.

To implement the simplex optimization, start values are initially established for the correction parameters, i.e. the start coefficients of the deskewing function. An image deskewing is then implemented with the deskewing function with the set start coefficients, wherein according to Equations (2a) and (2b) no alteration occurs in the readout direction r and a deskewing is only implemented in the phase coding direction p. Multiple sets of start coefficients are thereby typically started with, and for each start coefficient set a distortion map V(r,p) is calculated and applied to the image (i.e. to each individual value p). Given n coefficients or correction parameters to be calculated, (n+1) start points are typically used in this method. (n+1) deskewed images are then obtained. However, in principle the number of start points is arbitrary.

The measure of similarity between each deskewed image and the reference image is then determined. For example, the "Normalize Mutual Information" NMI can be used as a typical measure of similarity. However, other measures of similarity can also be applied in principle. A check of whether the measure of similarity is sufficiently large (and thus whether the optimal correction parameters have been found) subsequently takes place. If this is not the case, new optimized correction parameters are determined according to a predetermined strategy (that depends on the actual selected optimization method) and the loop is then run through again beginning with a deskewing with the new correction parameters. This method is continued iteratively until it has finally been established that the optimal correction parameters have been found according to the predetermined strategy, for example until a termination criterion is satisfied, for example a maximum number of iterations has been reached or the images are similar except for a specific $\epsilon$ value.

For example, the determination of the correction parameters can take place in a correction parameter determination unit 17 of the magnetic resonance system (see FIG. 1) of the central control unit 13. The matching correction parameters can then be stored in a memory 19 by the correction parameter determination unit 17 or be transferred immediately to an image correction unit 18 that, using the deskewing function with the determined correction parameters, respectively deskews the magnetic resonance images reconstructed by the reconstruction unit 20.

In FIG. 1 the correction parameter determination unit 17 and the image correction unit 18 are represented as separate blocks networked with one another. In principle, however, the image correction unit 18 can also be integrated into the correction parameter determination unit 17, primarily if both units are implemented in the form of suitable software mods on a computer of the central control unit 13. In particular, it is namely also possible that the deskewing of the diffusion-weighted magnetic resonance images on the basis of the deskewing function and the correction parameters does not take place separately after the correction parameters have been determined, but rather that the deskewing is conducted automatically in the last step of the optimization method to determine the optimal correction parameters. This is always suggested if the determination of the correction parameters is conducted anyway based on usable measurements, i.e. if (for example) one of the adjustment measurements described above—for example the second measurement—is also simultaneously the usable measurement. However, a storing of the correction parameters (be they as transformation parameters or in the form of deskewing maps derived from these) in a memory 19 is then reasonable in order to use the correction parameters for the determination of correction parameters of other slices, as this is also the case in the exemplary embodiment according to FIG. 2 (as explained in the following). Namely, there in Step 2.IV only the optimal correction parameters for a subset M of the N slices are determined in order to thus accelerate the method. For example, this can hereby be every n—the slice (for example every second or third slice) of the slice stack to be measured.

The determination of the correction parameters for the slices situated between the slices of the subset M accordingly first takes place in the subsequent Steps 2.V through 2.IX on the basis of the correction parameters determined in Step 2.IV.

The entire slice stack is thereby processed in succession, starting from a first slice. For this a running variable S=1 for the first slice is initially set in Step 2.V. In Step 2.VI it is checked whether the current slice S is an element of the subset M of the slices for which the optimal parameters have already been determined in Step 2.IV.

If this is the case (branch "y"), the running variable S is immediately incremented in Step 2.VIII, for example increased by 1. Otherwise (branch "n") in Step 2.VIII the optimal correction parameters are determined on the basis of information of adjacent slices. For example, this can take place in that the deskewing function selected for the slices of the subset M is used and the correction parameters are determined from the respective correction parameters determined for the adjacent slices under consideration of the position of the current slice S relative to the appertaining adjacent slices. This means that the unknown correction parameters or, respectively, transformation coefficients are determined per interpolation on the basis of the position of the slice relative to the next two neighboring slices with known transformation coefficients. The correction parameters that are thus determined can then be used immediately with the given distortion function in order to deskew the image of the current slice S. The incrementing subsequently takes place in Step 2.VIII.

In Step 2.IX it is then checked whether the last slice is reached, i.e. whether the running variable S exceeds the number N of the slices in the slice stack by 1 or not. If this is not the case, the workflow jumps back to Step 2.VI ("n" branch) in order to proceed with the next slice S+1. If the last slice N was processed, the method is ended in Step 2.X ("y" branch).

At this point it is noted that it is not absolutely necessary that the deskewing of the images takes place immediately in Step 2.VII. In principle it is also possible to determine the correction parameters for the respective slice, to store these in the memory and to only implement a deskewing of the images later. Given usage of deskewing maps, in Step 2.VII a determination of an interpolated deskewing map for the current slice can also take place on the basis of the deskewing maps of other slices for which the deskewing has already been determined in Step 2.IV.

With the method according to FIG. 2, the processing time can be significantly shortened overall precisely in registration methods or optimization methods that are relatively time-consuming. For example, if the correction parameters within the optimization are implemented for only every second slice of a slice stack, nearly a factor of two is gained in the total computing time. If a higher quality of the correction parameters is desired, in principle it is also possible in a variant of the method according to FIG. 2 that the determination of the correction parameters for the slices that do not belong to the subset M does not take place by means of a simple interpolation in a Step 2.VII, but rather that in this step an optimization method is also conducted analogous to the method in Step 2.IV, wherein here however the interpolated transformation coefficients are used as start values for the search for the optimal transformation parameters in the respective slice. The computing time in the optimization method can thereby likewise already be significantly shortened.

FIG. 3 shows an additional variant of the method according to FIG. 2. Here a diffusion-weighted diagnostic image is acquired in the first Step 3.I for each of the N slices of the slice stack.

A first adjustment image or reference image $R_1$ is then acquired with a defined diffusion weighting (possibly also with a diffusion weighting b=0) in Step 3.II for a subset M of the N slices. At least one additional diffusion-weighted adjustment image $R_2$ is then acquired in Step 3.III for the same subset M of slices.

In Step 3.IV (analogous to Step 2.III in the method according to FIG. 2) the deskewing functions are then determined for the M slices in that the relevant transformations or, respectively, the polynomial elements that lead to the relevant transformation are determined. As in the method according to FIG. 2, this step is optional and depends on in what manner the deskewing function is constructed.

Step 3.V then corresponds to Step 2.IV in the workflow according to FIG. 2, meaning that here the optimal correction parameters are determined for the M slices.

In Step 3.VI the running variable for the current slice is then set again to S=1, meaning that the first slice is begun with. In Step 3.VII the optimal correction parameters are determined in Step 3.VII, for example with an interpolation method on the basis of the correction parameters of the adjacent slices. This method step essentially corresponds to Step 2.VII in FIG. 2.

In Step 3.VIII the running variable S for the slice is incremented again and in Step 3.IX it is checked whether all slices have been processed. If no ("n" branch), the loop is run through for the next slice S+1 beginning at Step 3.VII; otherwise ("y" branch) the method is ended in Step 3.X.

In this method as well the deskewing of the images of the individual slices can also be respectively implemented immediately insofar as that a diffusion-weighted diagnostic image was already acquired (as shown in FIG. 3) for all N slices. In principle, however, Step 3.I can also only be implemented later, for example after Step 3.V. It is likewise possible to acquire the diffusion-weighted diagnostic images later for the N slices, to initially store the correction parameters determined in Step 3.IV and, after the measurement of the diffusion-weighted diagnostic images, to then deskew these on the basis of the previously determined correction parameters.

The difference between the method according to FIG. 3 and the method according to FIG. 2 in particular lies in that here two adjustment measurements or an adjustment measurement and a usable measurement serving as an additional adjustment measurement are not implemented here for all N slices, but rather that two adjustment measurements are implemented only for the slices of the subset M and otherwise only the usable measurements are implemented for all other slices. With this approach significant measurement time can be saved specifically given very short diffusion measurements (for example with only two diffusion weightings, three diffusion directions and two averagings, i.e. in total 12 measurements per slice). For example, in an adjustment method which is described in DE 2009 003 889, 9 additional adjustment measurements are implemented per slice 9. Assuming a slice stack with 20 slices, with the method according to FIG. 2 the number of necessary acquisitions can be reduced from 20·(12+9)=420 auf 20·12+10·9=330 if the adjustment measurements are simply conducted only for every second slice.

The SNR can additionally be markedly increased using thicker slices, and therefore the robustness of the method can be improved. For example, if only every second slice is acquired in the adjustment measurements, the thickness of the slices (and therefore the SNR) can be doubled without needing to fear overlapping effects between adjacent slices. This leads to greater robustness an precision in the determination of the optimal correction parameters.

FIG. 4 shows an additional alternative method in order to link the image information (contained in the adjustment measurements) of different slices with one another in order to obtain faster and/or better correction parameters for additional slices from these.

This method begins in Step 4.I with a first adjustment measurement being implemented and a reference image being acquired for each of the N slices of a slice stack. In Step 4.II an additional adjustment measurement $R_2$ is additionally implemented for each of the N slices, in which adjustment measurement $R_2$ a diffusion-weighted image is acquired. This second measurement $R_2$ in Step 4.II is thereby in turn at the same time the usable measurement, meaning that the images acquired there are also the diagnostically relevant images. It can be the case that the images acquired in Step 4.II possibly have a lower SNR.

In Step 4.III the image information of adjacent slices are then averaged. For example, if only two neighboring slices are averaged, an improvement of the SNR by a factor of $\sqrt{2}$ is therefore already incurred.

For the averaged images (that, due to the averaging, respectively correspond to the image of a slice which is so wide that it comprises the slices of all images entered into the averaging), a distortion function is then respectively, optionally determined in Step 4.IV via determination of the coefficients with the relevant transformations, analogous to how this was implemented in Step 3.IV in the method according to FIG. 3.

A determination of the optimal correction parameters for the averaged images then takes place in Step 4.V, likewise analogous to the method step 3.V in the method according to FIG. 3. The method steps 4.VI, 4.VIII, 4.IX, 4.X likewise proceed wholly analogous to Steps 3.VI, 3.VIII, 3.IX and 3.X in the method according to FIG. 3.

However, different than in Step 3.VII, here in Step 4.VII the determination of the optimal correction parameters for the current slice S does not take place via a simple interpolation based on correction parameters of adjacent slices; rather, depending on the determined correction parameters of the averaged images depending on slice position, the matching correction parameters for the current slice are described with a suitable function, for example with a polynomial or with a spline function.

In particular, the method according to FIG. 4 can also be combined with the method according to FIG. 2. This means that both an averaging can take place and an interpolation can be used at some points.

FIG. 5 shows an additional variant which runs analogous to the method according to FIG. 2. Steps 5.II, 5.III hereby correspond to Steps 2.I, 2.II und 2.III in the method according to FIG. 2.

However, what is now different in Step 5.IV than in Step 2.IV is that the optimal correction parameters are now determined not only for a subset M of N slices but rather for all N slices. In principle the deskewing here would thus already be ended in a conventional manner.

However, in the method according to FIG. 5 all N slices are checked again with regard to the quality of the correction parameters. For this the running variable in Step 5.V is initially set to S=1, meaning that the workflow begins with the first slice.

A quality check then takes place in Step 5.VI in which it is checked whether the deskewing quality for the current slice S is sufficient. For example, the quality criterion can thereby be a limit value for the maximum shift of a pixel in the image. If a larger shift than this maximum shift is determined in the deskewing as a correction of any pixel in the image, it is assumed that the result is not reliable, i.e. the predetermined quality criterion is not satisfied. For example, such a case can arise if the SNR in individual slices is too low or a patient has moved in the acquisition of individual slices. If the quality criterion is satisfied ("y" branch), the running variable is incremented for the slice S in Step 5.VIII. Otherwise ("n" branch), in Step 5.VII new optimal correction parameters are determined with sufficient quality for the current slice S on the basis of information of adjacent slices. The same methods as in Step 2.VII can thereby be used in the method according to FIG. 2. The deskewing of the image can then likewise take place immediately in Step 5.VII on the basis of the new correction parameters.

The running variable S is subsequently incremented, and in Step 5.IX it is checked whether all slices have already been handled. If this is not the case ("n" branch), in Step 5.VI the quality check is initially implemented for the next slice and the loop is run through again. Otherwise ("y" branch) the method is ended in Step 5.X.

In all methods described in the preceding, a filter function can be applied to the correction parameters of different slices before they are used for a deskewing in order to achieve a smoothing of the correction parameters across adjacent slices, for example.

The method described here can in particular also be used advantageously within the scope of the method described in DE 2009 003 889 to improve the correction of image distortions. At least one of the two adjustment measurements is thereby respectively implemented with a predetermined diffusion weighting in three orthogonal diffusion directions, and correction parameters based on these are determined for the three orthogonal diffusion directions. Correction parameters for diffusion-weighted MR images with arbitrary diffusion direction can then be determined via linear combination from the correction parameters for the three orthogonal diffusion directions.

Furthermore, both the methods of Bodammer et al. and that of Haselgrove et al. can be used in the implementation of the method. In the method described by Haselgrove the first adjustment measurement corresponds with the first diffusion weighting of the reference measurement without diffusion gradient. In this case this means that the first diffusion weighting would be zero. The second adjustment measurement can then be implemented in the three orthogonal diffusion directions with the predetermined diffusion weighting. In the application of the method according to the invention to the method of Bodammer et al., for example, the first adjustment measurement with the first diffusion weighting would be the negative diffusion weighting while the second adjustment measurement would be the measurement with the same, positive diffusion weighting.

In the adjustment measurements the movement of the examination subject can likewise be detected, wherein the correction parameters are used only for the deskewing of the diffusion-weighted MR images if the movement is less than a predetermined limit value. DE 2009 003 889, the content of which is inasmuch incorporated here, is referenced for the details of the aforementioned methods.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to reduce distortions in magnetic resonance diffusion imaging, comprising the steps of:
operating a magnetic resonance data acquisition unit to implement a first measurement with a first diffusion weighting to obtain magnetic resonance data from a plurality of slices of an examination subject that are spatially separated from each other;
operating said magnetic resonance data acquisition unit to implement at least one second measurement with a second diffusion weighting to acquire magnetic resonance data from a plurality of slices of the examination subject that are spatially separated from each other;
supplying the magnetic resonance data obtained in said at least one first measurement and said at least one second measurement to a computerized processor and, in said computerized processor automatically determining a distortion correction function and distortion correction parameters to distortion-correct diffusion-weighted magnetic resonance images reconstructed from said magnetic resonance data obtained in said at least one first measurement and said at least one second measurement, and electronically linking at least one of the magnetic resonance data and the correction parameters of different slices with each other; and
in said computerized processor, distortion-correcting said diffusion-weighted magnetic resonance images using said distortion correction function and said distortion correction parameters.

2. A method as claimed in claim 1 wherein said slices are first slices and wherein said correction parameters are first correction parameters, and comprising, in said processor, executing an optimization procedure to determine second correction parameters for second slices of said subject, using said first correction parameters determined for said first slices as starting values in said optimization procedure.

3. A method as claimed in claim 1 comprising determining said correction values respectively for said individual slices for which said magnetic resonance data was obtained in said first and second measurements, and, in said processor, using said correction parameters to interpolate correction parameters for further slices situated between said slices.

4. A method as claimed in claim 3 comprising operating said magnetic resonance data acquisition unit to implement said first and second measurements only for said slices for which said correction parameters are determined.

5. A method as claimed in claim 3 comprising, in said processor, executing an optimization procedure to determine correction parameters for said further slices, by interpolating said correction values for said slices.

6. A method as claimed in claim 1 comprising, in said processor, averaging said magnetic resonance data for adjacent slices among the slices from which said magnetic resonance data were obtained in said first and second measurements, to obtain averaged image data, and determining at least one of said distortion correction function and said correction parameters using said averaged image data.

7. A method as claimed in claim 6 comprising determining said correction parameters using said averaged image data, by operating a spatial conversion function on respective slices, dependent on a slice position of said respective slices.

8. A method as claimed in claim 7 comprising employing a spatial conversion function comprising a polynomial function of a spline function.

9. A method as claimed in claim 1 comprising, for each slice, determining said distortion correction function and correction parameters and implementing a distortion correction for that slice using the distortion correction function and correction parameters determined therefor, and implementing a quality check of said distortion correction based on a predetermined quality criterion and, if said predetermined quality criterion is not satisfied, determining at least one of a new distortion correction function or new correction parameters for that slice using at least one of magnetic resonance data and correction parameters of a slice adjacent thereto.

10. A method as claimed in claim 1 comprising, in said processor, applying a filter function to respective correction parameters for respectively different slices, to obtain filtered correction parameters, and implementing the distortion correction for said respectively different slices using said filtered correction parameters.

11. A method as claimed in claim 1 comprising operating said magnetic resonance data acquisition unit to emit a plurality of preparation gradient pulses immediately preceding said first measurement, dependent on the diffusion weighting employed in said first measurement, and operating said magnetic resonance data acquisition unit to generate a plurality of preparation gradient pulses, immediately preceding said second measurement dependent on the diffusion weighting employed in said second measurement.

12. A method as claimed in claim 1 comprising, in said processor, implementing said distortion correction in a logical imaging coordinate system having a first axis in a readout direction employed in said first and second measurements, and a second coordinate axis in a phase coding direction employed in said first and second measurements, and implementing said distortion correction only in said phase coding direction.

13. A method as claimed in claim 1 comprising employing, in said processor as said distortion correction function, a non-linear, system-specific distortion correction function determined based on system-specific information with respect to at least said magnetic resonance data acquisition unit.

14. A magnetic resonance system comprising:
a magnetic resonance data acquisition unit;
a control unit being configured to operate a magnetic resonance data acquisition unit to implement a first measurement with a first diffusion weighting to obtain magnetic resonance data from a plurality of slices of an examination subject that are spatially separated from each other;
said control unit being configured to operate said magnetic resonance data acquisition unit to implement at least one second measurement with a second diffusion weighting to acquire magnetic resonance data from a plurality of slices of the examination subject that are spatially separated from each other;
a computer processor supplied with the magnetic resonance data obtained in said at least one first measurement and said at least one second measurement, said computerized processor being configured to automatically determine a distortion correction function and distortion correction parameters to distortion-correct diffusion-weighted magnetic resonance images reconstructed from said magnetic resonance data obtained in said at least one first measurement and said at least one second measurement, and to electronically link at least one of the magnetic resonance data and the correction parameters of different slices with each other; and said computerized processor being configured to distortion-correct said diffusion-weighted magnetic resonance images using said distortion correction function and said distortion correction parameters.

* * * * *